United States Patent
Matsumoto

(10) Patent No.: US 7,781,293 B2
(45) Date of Patent: Aug. 24, 2010

(54) SEMICONDUCTOR DEVICE AND METHOD OF FABRICATING THE SAME INCLUDING TRENCHES OF DIFFERENT ASPECT RATIOS

(75) Inventor: Takanori Matsumoto, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 484 days.

(21) Appl. No.: 11/611,030

(22) Filed: Dec. 14, 2006

(65) Prior Publication Data

US 2007/0082458 A1 Apr. 12, 2007

Related U.S. Application Data

(62) Division of application No. 11/085,112, filed on Mar. 22, 2005, now abandoned.

(30) Foreign Application Priority Data

Mar. 23, 2004 (JP) .............................. 2004-085051

(51) Int. Cl.
 *H01L 21/336* (2006.01)
 *H01L 21/76* (2006.01)
 *H01L 21/302* (2006.01)

(52) U.S. Cl. ...................... 438/296; 438/427; 438/711; 257/E21.49; 257/E21.492; 257/E21.495; 257/E21.548; 257/E21.549

(58) Field of Classification Search ................ 438/427, 438/296, 711; 257/E21.245, E21.488, E21.49, 257/E21.492, E21.495, E21.548, E21.549; 428/427
See application file for complete search history.

(56) References Cited

U.S. PATENT DOCUMENTS

| | | | | |
|---|---|---|---|---|
| 5,731,221 A | * | 3/1998 | Kwon | 438/426 |
| 6,060,370 A | * | 5/2000 | Hsia et al. | 438/424 |
| 6,159,801 A | * | 12/2000 | Hsieh et al. | 438/259 |
| 6,242,788 B1 | | 6/2001 | Mizuo | |
| 6,303,460 B1 | * | 10/2001 | Iwamatsu | 438/401 |
| 6,350,655 B2 | | 2/2002 | Mizuo | |
| 6,368,937 B1 | * | 4/2002 | Nakamura | 438/401 |
| 6,521,538 B2 | | 2/2003 | Soga et al. | |
| 6,869,859 B2 | * | 3/2005 | Saito | 438/427 |

(Continued)

FOREIGN PATENT DOCUMENTS

| | | |
|---|---|---|
| JP | 3-196624 | 8/1991 |
| JP | 6-232249 | 8/1994 |
| JP | 9-289313 | 11/1997 |
| JP | 11-307627 | 11/1999 |
| JP | 2001-68543 | 3/2001 |
| JP | 2002-43413 | 2/2002 |
| JP | 2004-87843 | 3/2004 |
| KR | 10-2004-0016695 | 2/2004 |

*Primary Examiner*—Walter L Lindsay, Jr.
*Assistant Examiner*—Ron Pompey
(74) *Attorney, Agent, or Firm*—Oblon, Spivak, McClelland, Maier & Neustadt, L.L.P.

(57) ABSTRACT

A method of fabricating a semiconductor device includes etching a silicon oxide film, a silicon nitride film, a polycrystalline silicone film, and a gate insulating film in a predetermined pattern including a first opening width corresponding to a first trench and a second opening width corresponding to a second trench, the second opening width being larger than the first opening width, and etching the semiconductor substrate to simultaneously form the first and second trenches so that a first depth of the first trench is equal to a second depth of the second trench, and a first angle between a first side surface and a first bottom surface of the first trench is smaller than a second angle between a second side surface and a second bottom surface of the second trench, and the first trench includes a curved portion at an upper portion of the first side surface.

4 Claims, 7 Drawing Sheets

U.S. PATENT DOCUMENTS

| | | |
|---|---|---|
| 6,914,316 B2 | 7/2005 | Yun et al. |
| 7,018,929 B2 * | 3/2006 | Chen et al. .................. 438/706 |
| 7,268,056 B2 * | 9/2007 | Sumino et al. ............. 438/427 |
| 7,482,178 B2 * | 1/2009 | Mui et al. ..................... 438/14 |
| 7,553,767 B2 * | 6/2009 | Cho et al. ................... 438/689 |
| 2002/0006715 A1 * | 1/2002 | Chhagan et al. ............. 438/585 |
| 2004/0048444 A1 * | 3/2004 | Seo ............................ 438/427 |
| 2008/0166854 A1 * | 7/2008 | Shin et al. .................. 438/427 |

* cited by examiner

SEMICONDUCTOR DEVICE AND METHOD OF FABRICATING THE SAME INCLUDING TRENCHES OF DIFFERENT ASPECT RATIOS

CROSS-REFERENCE TO RELATED APPLICATION

This application is a divisional of and claims the benefit of priority under 35 USC §120 from U.S. Ser. No. 11/085,112, filed Mar. 22, 2005 and is based upon and claims the benefit of priority under 35 USC §119 from the Japanese Patent Applications No. 2004-85051, filed Mar. 23, 2004, the entire contents of which is incorporated herein by reference.

BACKGROUND OF THE INVENTION

1. Field of the Invention

The present invention relates to a semiconductor device provided with trenches having high and low aspect ratios respectively and a method of fabricating the same.

2. Description of the Related Art

Semiconductor devices employ a shallow trench isolation (STI) structure in order that elements may be isolated from each other. A trench is formed in a semiconductor substrate and filled with an insulating material such as silicon oxide ($SiO_2$), whereby the element isolating STI structure is formed.

In forming a trench, a semiconductor substrate with an etching pattern is disposed in a vacuum process chamber of a processing apparatus. A reactive gas is then introduced into the chamber and a discharge plasma is generated so that reactive ions and radicals progress etching, whereby a trench is formed. A film of insulating material is formed on the trench, whereupon the STI structure is obtained. An amount and/or energy of each of ion and radical is adjusted so that an etched film is formed into a desired geometry or so that a deposited film has a high trench fill capability and high fabricating and film-forming speeds are ensured.

However, an aspect ratio of the STI region is increased as the size of a device structure is reduced. With this, the trench fill capability of an insulating film material tends to be reduced. As a result, the trench cannot completely be filled with the insulating film material, whereupon voids are formed in the trench. The voids further result in a new failure such as short circuit between the elements with an increasing frequency of occurrence. JP-A-2000-43413 discloses an improvement in the trench fill capability of the insulating film in the trench.

In order that the trench fill capability of the insulating film may be improved, it is suggested that a taper angle of STI or an inclination of sidewalls relative to the trench bottom be reduced, that is, the inclination of trench sidewalls be gentler. However, this method has the following inconvenience. That is, a distance between devices needs to be set to be shorter as miniaturization of the device structure progresses. In this case, when the taper angle is reduced in consideration of the aforementioned respect, a distance between portions where sidewalls intersect the bottom becomes shorter. Accordingly, limitations of a lower limit value of the taper angle become strict according to an opening width of the trench such that the limitations are difficult to cope with.

When the taper angle is reduced as described above, an insulation distance between the devices becomes short such that the breakdown voltage is reduced. This results in a reduction in the function of STI, that is, function of isolating elements adjacent to each other. Accordingly, in order that the aforementioned inconvenience may be prevented, the taper angle needs to be maintained at a large value. Thus, the conditions under which the opening width of the trench gives advantage to the trench fill capability is contrary to those under which the taper angle gives advantage to the trench fill capability. Under these conditions, the trench fill capability is hard to maintain at the level of the previous design rules.

In order that the trench fill capability of insulating film may be improved, for example, the trench filling step needs to be repeated several times, instead of forming the insulating film at a single step so that the trench is completely filled with the insulating film. In this case, however, the productivity cannot be improved even if the trench fill capability can be satisfied. Additionally, it is difficult to reduce the costs.

BRIEF SUMMARY OF THE INVENTION

Therefore, an object of the present invention is to provide a semiconductor device in which a desirable trench fill capability of the insulating film in the trench with high aspect ratio can be maintained even if the miniaturization of the device progresses, and a method of fabricating the same.

There is provided a method of fabricating a semiconductor device, including steps of forming a gate insulating film on a semiconductor substrate including a memory cell region and a peripheral circuit region, forming a polycrystalline silicon film on the gate insulating film, forming a silicon nitride film on the polycrystalline silicon film, forming a silicon oxide film on the silicon nitride film, etching the silicon oxide film, the silicon nitride film, the polycrystalline silicon film and the gate insulating film in a predetermined pattern including a first opening width corresponding to a first trench in the memory cell region and a second opening width corresponding to a second trench in the peripheral circuit region, the second opening width being larger than the first opening width, and etching the semiconductor substrate to simultaneously form the first and second trenches with an etching gas made by mixing a halogen gas, a fluorocarbon gas and oxygen so that a first depth of the first trench is equal to a second depth of the second trench, and a first angle which is defined between a first side surface and a first bottom surface of the first trench is smaller than a second angle which is defined between a second side surface and a second bottom surface of the second trench, and the first trench includes a curved portion at an upper portion of the first side surface.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

Figure 1:
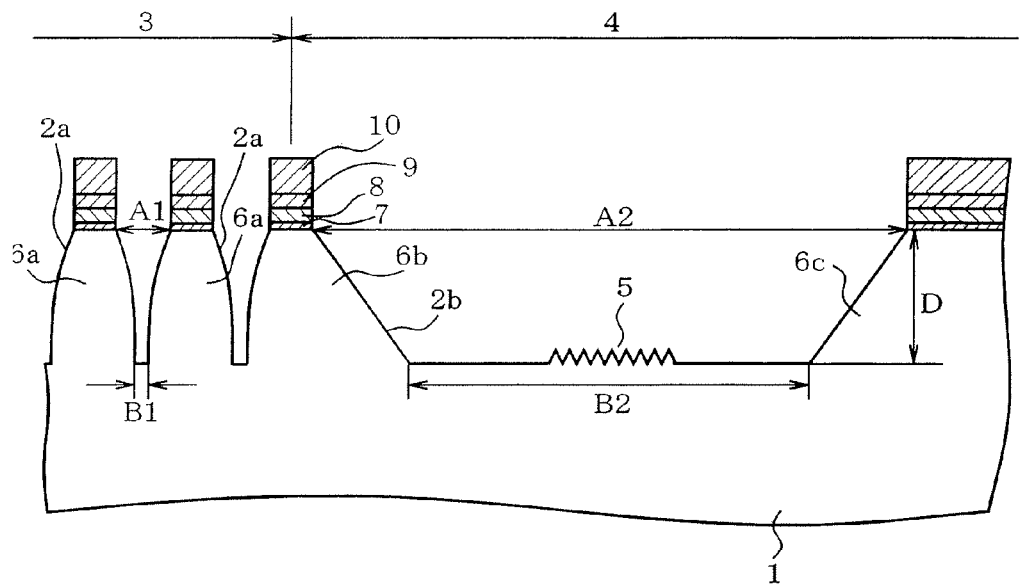
FIG. 1 is a typical section of a semiconductor device of one embodiment in accordance with the present invention, showing the state of the device after execution of a trench forming process.
Figure 2:
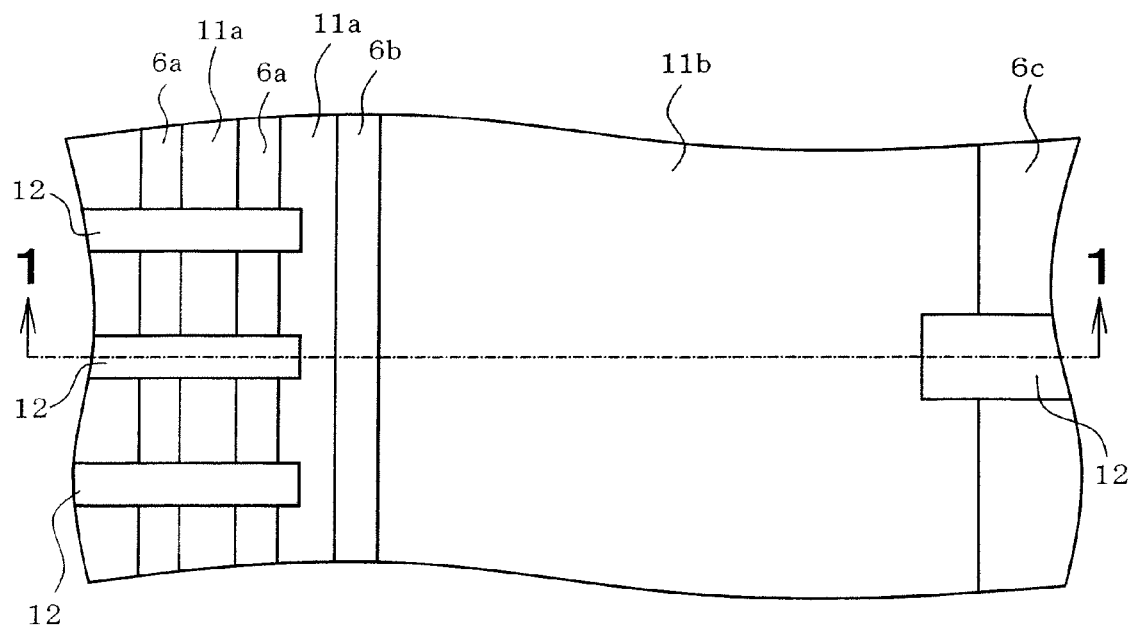
FIG. 2 is a typical plan view of the semiconductor device, showing a state where a gate electrode has been formed.

One embodiment of the present invention will be described with reference to the accompanying drawings. The invention is applied to a flash memory which is one type of non-volatile memory. Referring to FIG. 1, the state of the semiconductor device after execution of a trench forming process is shown. FIG. 2 shows a control gate electrode. FIG. 1 is a sectional view taken along line 1-1 in FIG. 2. Chips composing the flash memory each include a memory cell region in which a number of memory cells are formed and a peripheral circuit region in which peripheral circuits for driving the memory cells are formed.

A silicon substrate 1 serving as a semiconductor substrate has trenches 2a and 2b for forming element isolation regions. The trenches 2a and 2b have opening widths A1 and A2 respectively and the same depth D as each other. The trench 2a has a higher aspect ratio R1 (D/A1) so as to correspond to a memory cell region 3, whereas the trench 2b has a lower aspect ratio R2 (D/A2) so as to correspond to the peripheral circuit region 4.

Transistors formed in the peripheral circuit region 4 include at least one having a higher break-down voltage. Accordingly, the width A2 of the trench 2b is set to be larger that the width A1 of the trench 2a. The trench 2b has a bottom which is formed so that residue 5 is deposited without being etched. The residue 5 can be suppressed when an etching gas ratio which is one of etching conditions is optimized.

Three active regions 6a, 6b and 6c are separately formed in the memory cell region 3, a boundary and peripheral circuit region 4 respectively. On the upper surface of the substrate 1 are deposited a silicon oxide film 7 serving as a gate insulating film, a polycrystalline silicon film 8 serving as a gate electrode material, a silicon nitride film 9 serving as a stopper in a chemical-mechanical polishing process and a silicon oxide film 10 serving as an etching mask for the substrate 1 sequentially in the active regions 6a to 6c.

In the structure as shown in FIG. 2, silicon oxide films are buried in the respective trenches 2a and 2b so that STI structure regions 11a and 11b are formed. Further, control gate electrodes 12 are formed so as to extend across the active regions 6a and 6c.

Figure 3:
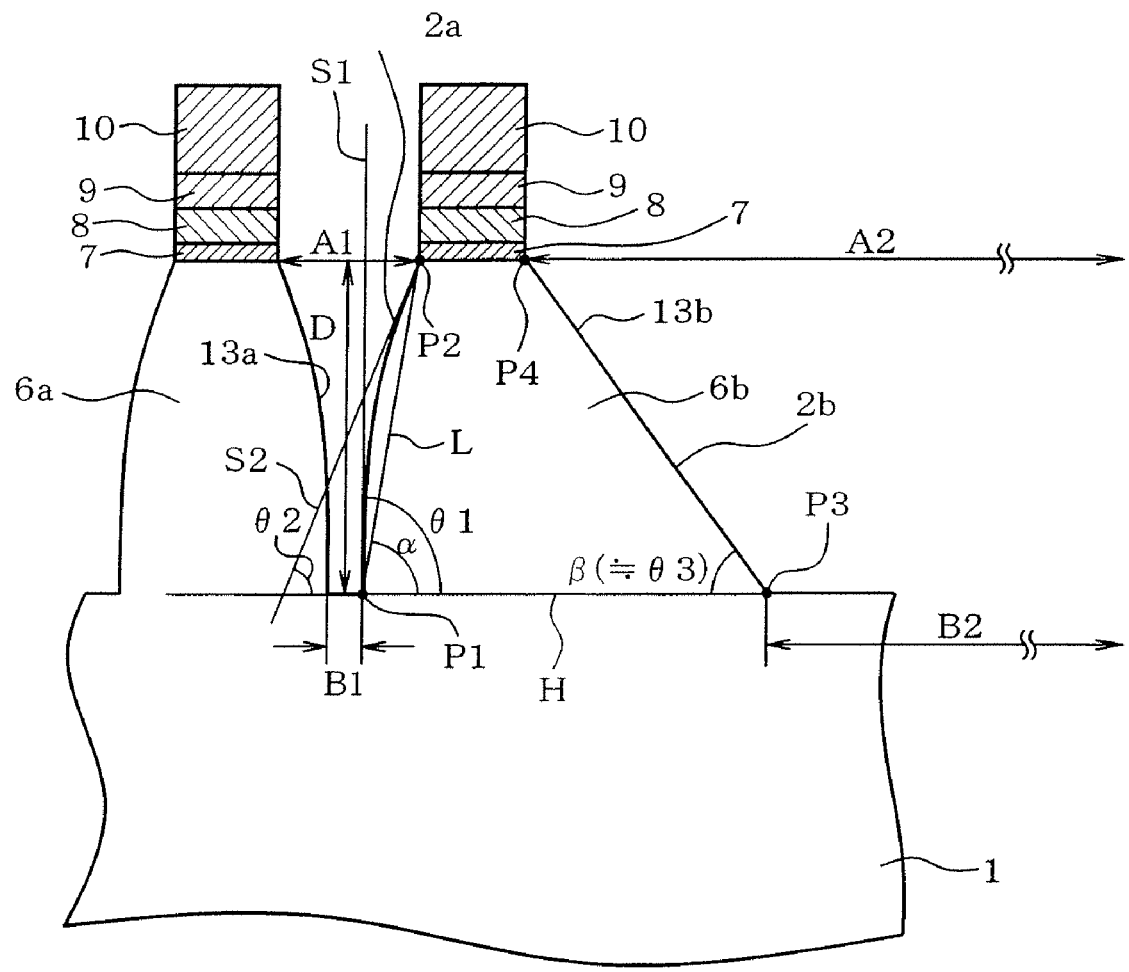
FIG. 3 is a typical section of the semiconductor device, showing the configuration of the trench in detail.

In order that geometries of trenches 2a and 2b may be compared with each other, FIG. 3 shows a section of a boundary where the trenches 2a and 2b with higher and lower aspect ratios respectively are adjacent to each other or the active regions 6a and 6b. In the figure, the trench 2a is formed so that a width B1 at the bottom thereof is smaller or narrower than a width A1 at the upper opening in the silicon substrate 1.

Referring now to FIG. 3, a taper angle is defined as an angle made by line L extending from a bottom end P1 to an opening end P2 and line H parallel to the bottom on one hand, when symbol "α" designates a taper angle of the trench 2a, a sidewall 13a of the trench 2a rises up at the bottom end P1 with a steeper inclination θ1 nearer to a right angle than the taper angle α. The inclination θ1 is made by a tangent line S1 along the sidewall 13a at the bottom end P1 and parallel line H. The inclination of the sidewall 13a gradually becomes gentler as the sidewall 13a goes upward and has, at the opening end P2, a smaller inclination θ2 than the taper angle α. The inclination θ2 is made by a tangent line S2 along the sidewall 13a at the opening end P2 and parallel line H.

The sidewall 13a of the trench 2a has a rounded shape near the opening end P2 while satisfying the above-described conditions. Consequently, the trench 2a is formed so that a degree of opening is increased from the bottom toward the opening or so that the inner section thereof is trumpet-shaped.

On the other hand, when symbol "β" designates a taper angle of the trench 2b, a sidewall 13b of the trench 2b is formed so as to have, from the bottom end P3 to the opening end P4, an inclination θ3 which is substantially equal to the taper angle β. Furthermore, the trench 2b is formed so that an inclination θ3 at the opening end P4 is substantially equal to the inclination θ2 at the opening end P2 of the trench 2a. The aforementioned inclinations θ1, θ2 and θ3 serve as first, second and third inclinations respectively. The taper angles α and β are shown by the following equations (1) and (2) on the basis of the aforementioned dimensions:

$$\text{Taper angle } \alpha = \arctan(2D/(A1-B1)) \qquad (1)$$

$$\text{Taper angle } \beta = \arctan(2D/(A2-B2)) \qquad (2)$$

The inclinations θ2 and θ3 need not be substantially equal to each other but the inclination θ3 needs to be smaller than inclination θ1.

As described above, the trench 2a is formed so that the inclination of the sidewall thereof is gentle near the opening and steep near the bottom. The trench 2b is formed so that the inclination of the sidewall thereof is smaller than that near the bottom of the trench 2a and is uniform. Consequently, the trench fill capability of the silicon oxide film filling the interior of the trench is improved. The reason for this would be that a capacity of the trench 2a with the higher aspect ratio is decreased as compared with the other trench 2a such that the trench fill capability is improved, as will be understood from the results of comparison later. Further, the silicon oxide film for filling the trench can be made by a single process, and a film thickness need not be increased for improvement of the trench fill capability. Consequently, the productivity can be improved.

The fabrication process up to the structure of FIG. 1 will be described with reference to FIGS. 4A to 4D. Firstly, on the silicon substrate 1 are sequentially formed the silicon oxide film 7, polycrystalline silicon film 8, silicon nitride film 9 and silicon oxide film (boro-silicate glass (BSG) film) 10. The silicon oxide film 7 serves as a gate insulating film of the floating gate. The polycrystalline silicon film 8 constitutes apart of the floating gate (another polycrystalline silicon film will be deposited in an assembly and testing process). The silicon nitride film 9 serves as a stopper in the chemical-mechanical polishing (CMP) process. The silicon oxide film 10 serves as a mask material in etching the silicon substrate 1.

Figure 4A:
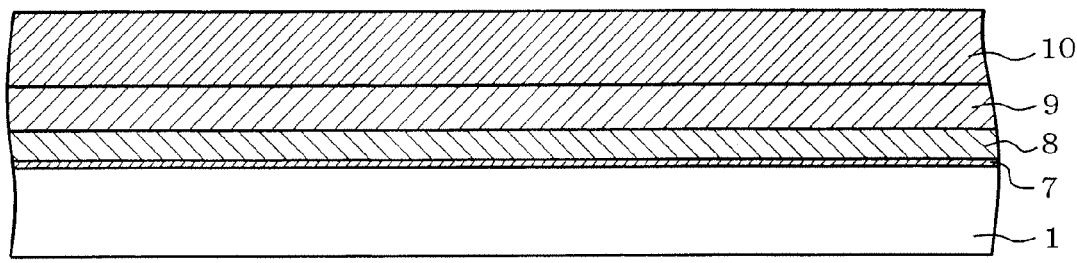
FIGS. 4A to 4D are typical sectional views of the semiconductor device corresponding to stages in the fabrication process.
Figure 4B:
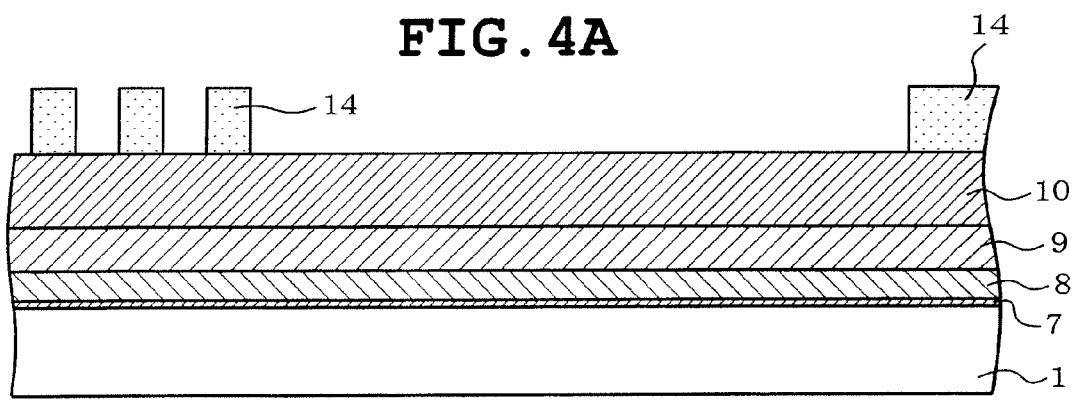
Figure 4C:
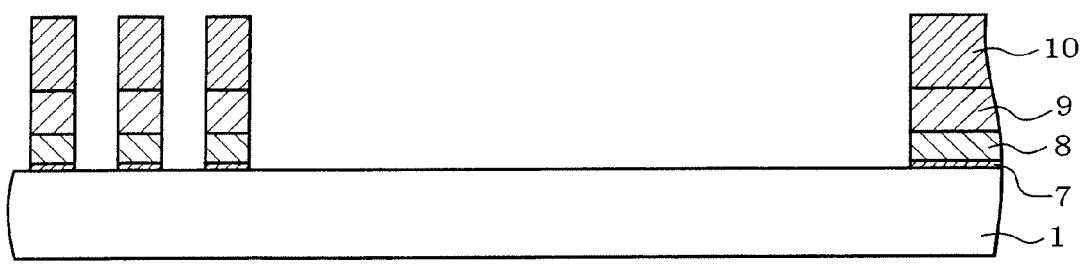
Figure 4D:
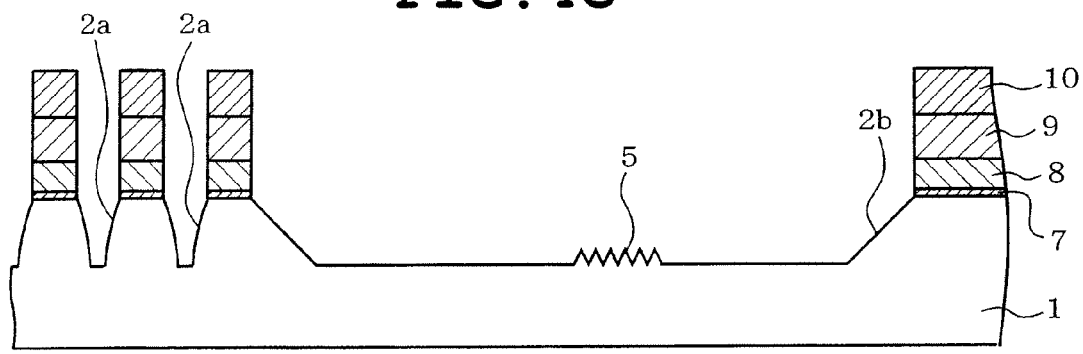

Subsequently, a resist 14 is applied so as to correspond to the active regions 6a to 6c and then exposed to light so as to be patterned, as shown in FIG. 4B. Thereafter, the silicon oxide film 10 is etched with the resist 14 serving as a mask, and then, the resist 14 is removed, as shown in FIG. 4C. The silicon nitride film 9, polycrystalline silicon film 8 and silicon oxide film 7 are etched with the silicon oxide film 10 serving as a mask. Subsequently, as shown in FIG. 4D, the silicon substrate 1 is etched using an etching gas in a reactive vacuum container of a processing apparatus so that the trenches 2a and 2b are formed. The etching gas contains a halogen gas to which a fluorocarbon gas and oxygen are added. The halogen gas includes $Cl_2$ (chlorine gas) and HBr (hydrogen bromide gas). The fluorocarbon gas includes $CF_4$, $CHF_3$, $CH_2F_2$, $C_5F_8$ and $C_4F_6$. The halogen gas is mainly used for the etching. The etched silicon is oxidized using oxygen such that silicon oxide is produced as a reaction product, which is deposited on the surface of the silicon substrate 1. The fluorocarbon gas has a function of re-etching the reaction product deposited as the silicon oxide resulting in residue, thereby blowing away the reaction product.

On one hand, the silicon oxidized by oxygen becomes difficult to advance into the bottom side in the trench with the higher aspect ratio, namely, the trench 2a of the memory cell region 3. An amount of silicon oxide is reduced as the bottom of the trench 2a is dug downward by etching. Accordingly, the inclination of the sidewall 13a is increased. On the other hand, since the trench 2b with lower aspect ratio has a larger opening width A2, the silicon oxide is capable of reaching the bottom. As a result, the sidewall 13b is formed to have a gentle inclination θ3.

Thus, when the mixing ratio of the aforementioned gas is suitably set, an amount of reaction product can be controlled or an amount of deposited reaction product can be controlled, whereupon the conditions under which a desired geometry of the trench can be achieved. Further, the above-described etching manner can form both trenches 2a and 2b by one time of etching process. Specific etching conditions are as follows: regarding the gas flow rate, the halogen gas is set to a flow rate of about 70%, oxygen is set to a flow rate of about 20% and fluorocarbon gas is set to a flow rate of about 10%. An etching pressure is set to about 20 mTorr and an RF power is set to about 500 W.

Figures 5A, 5B, 5C:
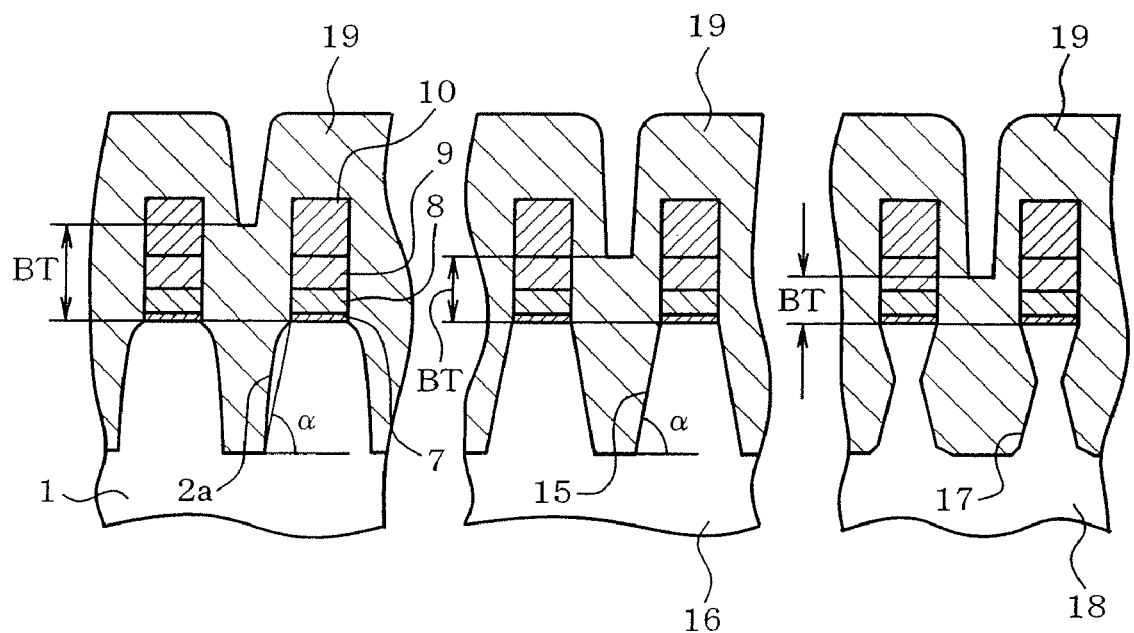
FIGS. 5A to 5C show configurations of trenches compared with one another with respect to the trench fill capability.

The trench fill capability of the silicon oxide film serving as an insulating film was examined regarding the trenches 2a and 2b of the embodiment and trenches formed for the comparison purpose and having geometries other than those of the trenches 2a and 2b. FIG. 5A shows the silicon substrate 1 having the trench 2a of the embodiment. FIG. 5B shows a silicon substrate 16 having a straight-tapered trench 15. FIG. 5C shows a silicon substrate 18 having a bowing trench 17. A silicon oxide film 19 is formed on each of the trenches 2a, 15 and 17 to be used to measure the trench fill capability.

Figures 6A, 6B, 6C:
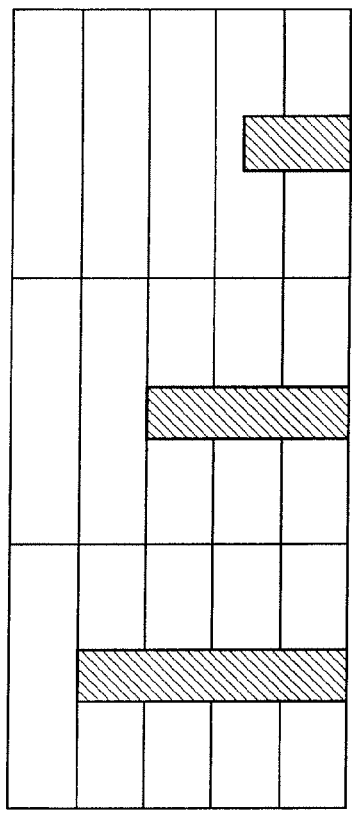
FIG. 6 is a graph showing dimensions indicative of the trench fill capability in different types of trenches.

FIG. 6 shows the trench fill capabilities of the trenches 2a, 15 and 17 of the silicon substrates 1, 16 and 18 respectively. DimensionBT (nm) indicative of the trench fill capability refers to the difference between an interface of the silicon substrate 1 and the silicon oxide film 7 and the trench bottom, as shown in FIG. 5A. The results show that the trench 2a of the embodiment has a largest dimension BT of the three, whereas the bowing trench 17 has a smallest dimension BT.

Furthermore, in a case where the taper angles α of the trenches 2a and 15 were set to the same, the trench fill capability was measured regarding the silicon substrate 1 of the embodiment and the silicon substrate 16 with the straight-tapered trench 15. Although the taper angles α were the same, the silicon substrate 1 had the dimension BT of 143 nm whereas the silicon substrate 16 had the dimension BT of 91 nm. As a result, the silicon substrate 1 formed with the trench 2a is superior to the other substrates in the trench fill capability.

In a state where the STIs 11a are formed, a distance between elements via the bottom of the trench 2a is uniform between the active regions adjacent to each other. Consequently, it can be understood that the trench fill capability is improved while the insulating characteristic is maintained.

Figure 7:
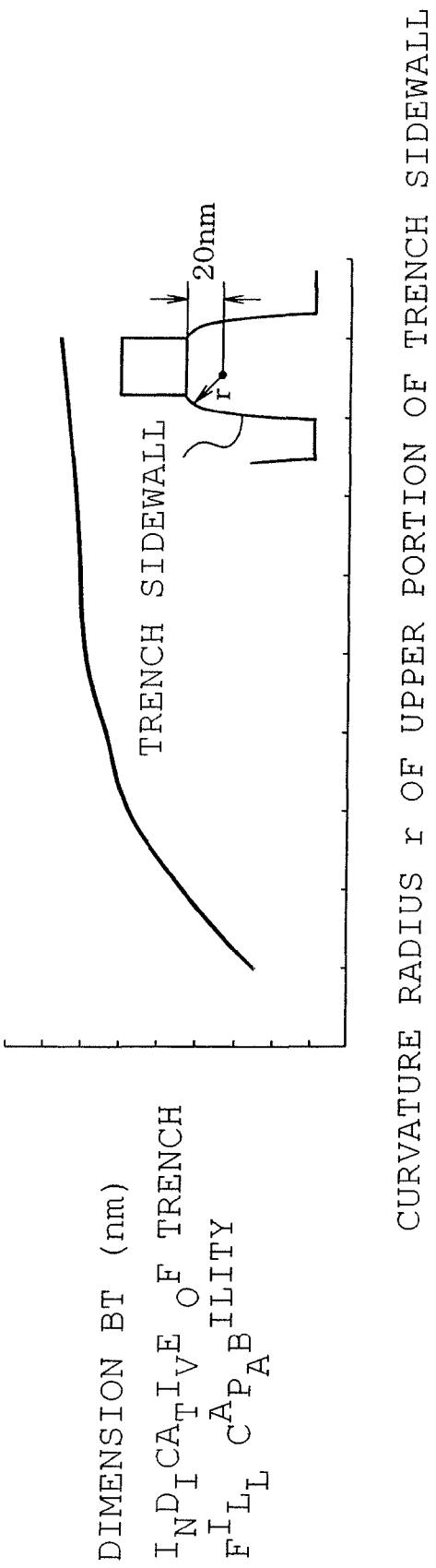
FIG. 7 is a graph showing the dimension indicative of the trench fill capability in the case where the curvature radius of the upper part of trench is changed.

The trench fill capability was evaluated regarding the silicon substrate 1 formed with the trench 2a in a case where the inclination θ2 of the trench opening side was changed. In this case, a rounded portion of the silicon substrate 1 at the opening side was approximated to a part of a circle, instead of the inclination θ2. A curvature radius r of the rounded portion served as a parameter. A value serving as the curvature radius r obtained at a portion about 20 nm deep from the upper surface of the silicon substrate 1. FIG. 7 shows that the trench fill capability can be improved (an increase in the dimension BT) with increase in the curvature radius r defined as described above. This signifies that the trench fill capability can be improved as the inclination θ2 is reduced. Accordingly, it can be understood that the dimension BT during the trench filling process can be adjusted by controlling the curvature radius r. Consequently, the number and time of fabrication steps can each be reduced to about two thirds in the conventional number and time, whereupon the number of fabrication steps can be reduced.

Figure 8:
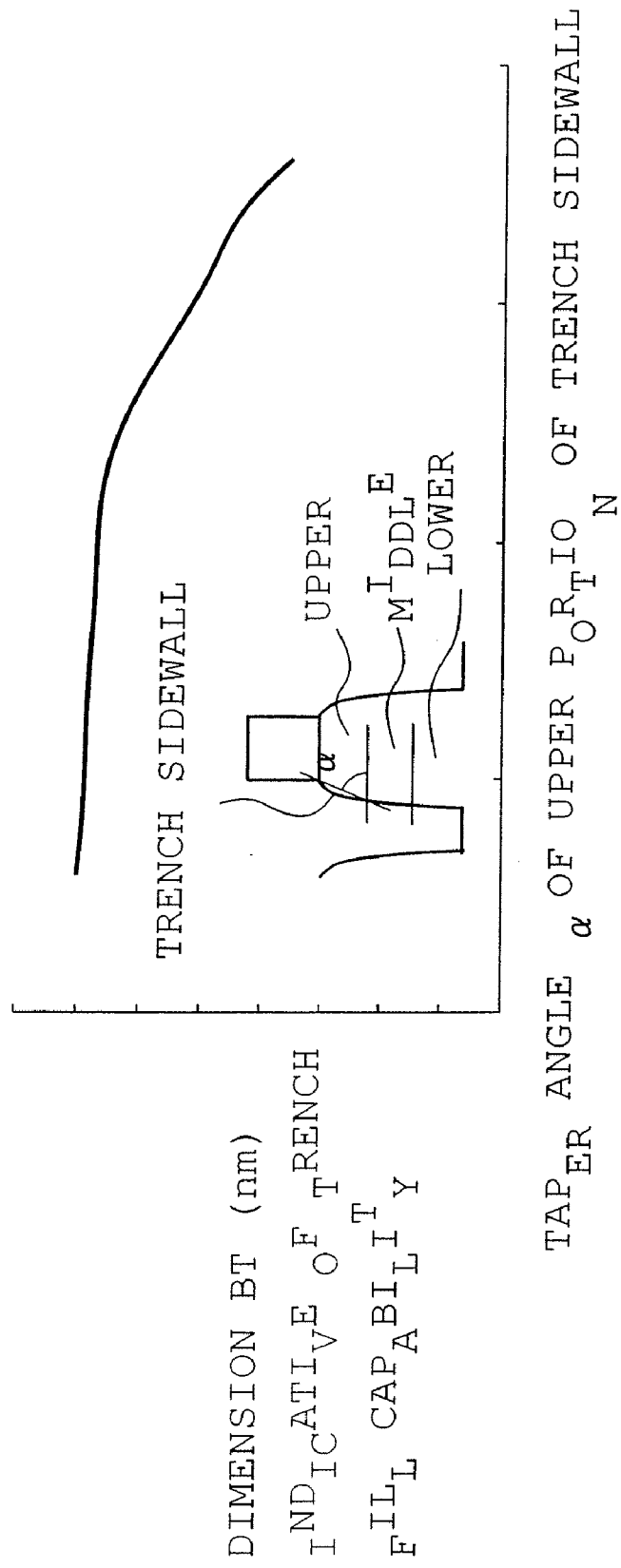
FIG. 8 is a graph showing the dimension indicative of the trench fill capability in the case where the taper angle of the upper part of trench is changed.

The trench fill capability of the trench 2a was evaluated by the simulation using a computer. In the simulation, the sidewall 16a of the trench 2a was divided into three stages, that is, upper, middle and lower parts in the direction of depth. Taper angles of the respective divided regions were changed and then combined together. The trench fill capability was evaluated in the same manner. Consequently, a degree of influence upon the trench fill capability was shown as upper inclined portion>middle inclined portion>lower inclined portion. As obvious from the results as shown in FIG. 8, the trench fill capability was found to be improved when the inclined angle is gentler or when the curvature radius is larger.

Summarizing the foregoing results, the trench fill capability can be improved when the opening side has a large curvature radius r or when the taper angle α is gentle, the element isolating function ensuring sufficient insulating performance can be provided while the trench filling capability can be ensured. In this evaluation, the sidewall 16a of the trench 2a was divided into three stages. However, the number of divided states is optional. In this case, too, the similar effect to the above-described one can be achieved.

Several modified forms will be described. An etching gas other than those exemplified above may be used when it belongs to the same type of gas. Furthermore, the mixing ratio or the flow rate may be set to a suitable value so that the same object as described above is achieved.

The invention may be applied to any type of non-volatile memory other than the flash memory. Additionally, the invention may be applied to any semiconductor device employing the arrangement in which a plurality of trenches having different aspect ratios and the trench interior is filled with an insulating film.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device, comprising:

forming a gate insulating film on a semiconductor substrate including a memory cell region and a peripheral circuit region;

forming a polycrystalline silicon film on the gate insulating film;

forming a silicon nitride film on the polycrystalline silicon film;

forming a silicon oxide film on the silicon nitride film;

etching the silicon oxide film, the silicon nitride film, the polycrystalline silicon film and the gate insulating film in a predetermined pattern including a first opening width corresponding to a first trench in the memory cell region and a second opening width corresponding to a second trench in the peripheral circuit region, the second opening width being larger than the first opening width; and etching the semiconductor substrate to simultaneously form the first and second trenches with an etching gas made by mixing a halogen gas, a fluorocarbon gas and oxygen so that a first depth of the first trench is equal to a second depth of the second trench, and a first angle which is defined between a first side surface and a first bottom surface of the first trench is smaller than a second angle which is defined between a second side surface and a second bottom surface of the second trench, and the first trench includes a curved portion at an upper portion of the first side surface.

2. The method of fabricating the semiconductor device according to claim 1, wherein the halogen gas includes a chlorine gas.

3. The method of fabricating the semiconductor device according to claim 1, wherein the fluorocarbon gas includes one of $CF_4$, $CHF_3$, $CH_2F_2$, $C_5F_6$ and $C_4F_6$.

4. The method of fabricating the semiconductor device according to claim 1, wherein the halogen gas is set to a flow rate of about 70%, the fluorocarbon gas is set to a flow rate of about 10% and the oxygen is set to a flow rate of about 20%.

* * * * *